(12) United States Patent
Chiang et al.

(10) Patent No.: US 6,413,383 B1
(45) Date of Patent: Jul. 2, 2002

(54) METHOD FOR IGNITING A PLASMA IN A SPUTTER REACTOR

(75) Inventors: Tony P. Chiang, San Jose; Yu D. Cong, Sunnyvale; Peijun Ding, San Jose; Jianming Fu, San Jose; Howard H. Tang, San Jose; Anish Tolia, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/685,988

(22) Filed: Oct. 10, 2000

Related U.S. Application Data

(62) Division of application No. 09/414,614, filed on Oct. 8, 1999.

(51) Int. Cl.[7] .............................................. C23C 14/34
(52) U.S. Cl. .............................. 204/192.13; 204/192.12
(58) Field of Search ........................ 204/192.12, 192.13, 204/298.07, 298.08

(56) References Cited

U.S. PATENT DOCUMENTS

| | | | | |
|---|---|---|---|---|
| 5,795,451 A | * | 8/1998 | Tan et al. ................. | 204/298.2 |
| 5,830,330 A | * | 11/1998 | Lantsman .............. | 204/298.07 |
| 6,080,285 A | * | 6/2000 | Liu et al. ................ | 204/298.08 |
| 6,080,286 A | * | 6/2000 | Okuda et al. .......... | 204/298.08 |
| 6,183,614 B1 | * | 2/2001 | Fu .......................... | 204/298.2 |

FOREIGN PATENT DOCUMENTS

EP  0 878 843   11/1998

OTHER PUBLICATIONS

Posadowksi, "Sustained Self Sputtering of Different Materials using DC magnetron", Vacuum, vol. 46, Nos. 8–10, pp. 1017–1020, 1995.*

Asamaki et al., "Copper self-sputtering by planar magnetron", Jpn. J. Appl. Phys.., vol. 33. part 1, No. 5a, May 1994, pp. 2500–2503.

Posadowski et al., "sustained self-sputtering using a direct current magnetron source" Journal Vaccum Science Technology A, vol. 11, No. 6, Nov./Dec. 1993, pp. 2980–2984.

* cited by examiner

Primary Examiner—Rodney G. McDonald
Assistant Examiner—Gregg Cantelmo
(74) Attorney, Agent, or Firm—Charles S. Guenzer, Esq.

(57) ABSTRACT

A DC magnetron sputter reactor for sputtering copper, its method of use, particularly the ignition sequence, and shields and other parts promoting self-ionized plasma (SIP) sputtering, preferably at pressures below 5 milliTorr, preferably below 1 milliTorr. The SIP copper layer can act as a seed and nucleation layer for hole filling with conventional sputtering (PVD) or with electrochemical plating (ECP). Preferably, the plasma is ignited in a cool process in which low power is applied to the target in the presence of a higher pressure of argon working gas. After ignition, the pressure is reduced, and target power is ramped up to a relatively high operational level to sputter deposit the film.

15 Claims, 6 Drawing Sheets

METHOD FOR IGNITING A PLASMA IN A SPUTTER REACTOR

RELATED APPLICATIONS

This application is a divisional of Ser. No. 09/414,614, filed Oct. 8, 1999, allowed which is incorporated herein by reference in its entirety.

FIELD OF THE INVENTION

The invention relates generally to sputtering. In particular, the invention relates to the sputter deposition of copper in the formation of semiconductor integrated circuits.

BACKGROUND ART

Semiconductor integrated circuits typically include multiple levels of metallization to provide electrical connections between the large number of active semiconductor devices. Advanced integrated circuits, particularly those for microprocessors, may include five or more metallization levels. In the past, aluminum has been the favored metallization, but copper has been developed as a metallization for advanced integrated circuits.

A typical metallization level is illustrated in the cross-sectional view of FIG. 1. A lower-level layer 10 includes a conductive feature 12. If the lower-level layer 10 is a lower-level dielectric layer, such as silica or other insulating material, the conductive feature 12 may be a lower-level copper metallization, and the vertical portion of the upper-level metallization is referred to as a via since it interconnects two levels of metallization. If the lower-level layer 10 is a silicon layer, the conductive feature 12 may a doped silicon region, and the vertical portion of the upper-level metallization is referred to as a contact because it electrically contacts silicon. An upper-level dielectric layer 14 is deposited over the lower-level dielectric layer 10 and the lower-level metallization 12. There are yet other shapes for the holes including lines and trenches. Also, in dual damascene and similar interconnect structures, as described below, the holes have a complex shape. In some applications, the hole may not extend through the dielectric layer. The following discussion will refer to only via holes, but in most circumstances the discussion applies equally well to other types of holes with only a few modifications well known in the art.

Conventionally, the dielectric is silicon oxide formed by plasma-enhanced chemical vapor deposition (PECVD) using tetraethylorthosilicate (TEOS) as the precursor. However, low-k materials of other compositions and deposition techniques are being considered, and the invention is equally applicable to them. Some of the low-k dielectrics being developed can be characterized as silicates, such as fluorinated silicate glasses. Hereafter, only silicate (oxide) dielectrics will be directly described, but the invention is applicable in large part to other dielectric compositions.

A via hole is etched into the upper-level dielectric layer 14 typically using, in the case of silicate dielectrics, a fluorine-based plasma etching process. In advanced integrated circuits, the via holes may have widths as low as 0.18 $\mu$m or even less. The thickness of the dielectric layer 14 is usually at least 0.7 $\mu$m, and sometimes twice this, so that the aspect ratio of the hole may be 4 or greater. Aspect ratios of 6 and greater are being proposed. Furthermore, in most circumstances, the via hole should have a vertical profile.

A liner layer 16 is conformally deposited onto the bottom and sides of the hole and above the dielectric layer 14. The liner 16 performs several functions. It acts as an adhesion layer between the dielectric and the metal since metal films tend to peel from oxides. It acts as a barrier against the inter-diffusion between the oxide-based dielectric and the metal. It may also act as a seed and nucleation layer to promote the uniform adhesion and growth and possibly low-temperature reflow for the deposition of metal filling the hole and to nucleate the even growth of a separate seed layer.

A metal layer 18, for example, of copper is then deposited over the liner layer 16 to fill the hole and to cover the top of the dielectric layer 14. Conventional aluminum metallizations are patterned into horizontal interconnects by selective etching of the planar portion of the metal layer 18. However, a preferred technique for copper metallization, called dual damascene, forms the hole in the dielectric layer 14 into two connected portions, the first being narrow vias through the bottom portion of the dielectric and the second being wider trenches in the surface portion which interconnect the vias. After the metal deposition, chemical mechanical polishing (CMP) is performed which removes the relatively soft copper exposed above the dielectric oxide but which stops on the harder oxide. As a result, multiple copper-filled trenches of the upper level, similar to the conductive feature 12 of the next lower level, are isolated from each other. The copper filling the trenches acts as horizontal interconnects between the copper-filled vias. The combination of dual damascene and CMP eliminates the need to etch copper. Several layer structures and etching sequences have been developed for dual damascene, and other metallization structures have similar fabrication requirements.

Filling via holes and similar high aspect-ratio structures, such as experienced in dual damascene, has presented a continuing challenge as their aspect ratios continue to increase. Aspect ratios of 4:1 are common, and the value will further increase. An aspect ratio is defined as the ratio of the depth of the hole to the narrowest width of the hole, usually near its top surface. Via widths of 0.18 $\mu$m are also common, and the value will further decrease. For advanced copper interconnects formed in oxide dielectrics, the formation of the barrier layer tends to be distinctly separate from the nucleation and seed layer. The diffusion barrier may be formed from a bilayer of Ta/TaN, W/WN, or Ti/TiN, or of other structures. Barrier thicknesses of 10 to 50 nm are typical. For copper interconnects, it has been found necessary to deposit one or more copper layers to fulfill the nucleation and seed functions. The following discussion will address the formation of the copper nucleation and seed layer as well as the final copper hole filling.

The deposition of the metallization by conventional physical vapor deposition (PVD), also called sputtering, is relatively fast. A DC magnetron sputtering reactor has a target composed of the metal to be sputter deposited and which is powered by a DC electrical source. The magnetron is scanned about the back of the target and projects its magnetic field into the portion of the reactor adjacent the target to increase the plasma density there to thereby increase the sputtering rate. However, conventional DC sputtering (which will be referred to as PVD in distinction to other types of sputtering to be introduced) predominantly sputters neutral atoms. The typical ion densities in PVD are less than $10^9$ cm$^{-3}$. PVD also sputters atoms into a wide angular distribution, typically having a cosine dependence about the target normal. Such a wide distribution is disadvantageous for filling a deep and narrow via hole 22 illustrated in FIG. 2, in which a barrier layer 24 has already been deposited. The large number of off-angle sputter particles cause a copper layer 26 to preferentially deposit around the upper corners of the hole 22 and form overhangs 28. Large overhangs further restrict entry into the hole 22 and at a minimum cause inadequate coverage of the sidewalls 30 and bottom 32 of the hole 22. At worst, the overhangs 28 bridge the hole 22 before it is filled and create a void 34 in the metallization within the hole 22. Once a void 34 has formed, it is almost impossible to reflow it out by heating the metallization to near its melting point. Even a small void introduces serious reliability problems. If a second copper deposition step is planned, such as by electroplating, the bridged overhangs make it impossible.

One approach to ameliorate the overhang problem is long-throw sputtering in a conventional reactor. In long-throw sputtering the target is spaced relatively far from the wafer being sputter coated. For example, the target-to-wafer spacing is at least 50% of wafer diameter, preferably is more than 90%, and more preferably is more than 140%. As a result, the off-angle portion of the sputtering distribution is preferentially directed to the chamber walls, but the central-angle portion remains directed to the wafer. The truncated angular distribution causes a higher fraction of the sputter particles to be directed deeply into the hole 22 and reduces the extent of the overhangs 28. A similar effect is accomplished by positioning a collimator between the target and wafer. Because the collimator has a large number of holes of high aspect ratio, the off-angle sputter particles strike the sidewalls of the collimator, and only the central-angle particles are passed. Both long-throw targets and collimators disadvantageously reduce the flux of sputter particles reaching the wafer. That is, they reduce the sputter deposition rate. The reduction becomes more pronounced as longer throws and stricter collimation become required for via holes of increasing aspect ratios. Long throw is further limited by the the longer substrate-to-target distance over which the sputtered particles must travel. At the few milliTorr of argon pressure used in conventional PVD even with long throw, there is a greater possibility of the argon scattering the sputtered particles. Hence, the geometric selection of the forward particles is decreased. A yet further problem with both long throw and collimation is that the reduced copper flux necessitates a longer deposition period. This not only reduces throughput, it also tends to increase the maximum temperature the wafer experiences during sputtering. Long throw reduces overhangs and provides good coverage in the middle and upper portions of the sidewalls, but the lower sidewall and bottom coverage are inferior.

Another technique for deep hole filling is sputtering using a high-density plasma (HDP) in a sputtering process called ionized metal plating (IMP). A high-density plasma is defined as one having an average plasma density across the plasma, exclusive of the plasma sheaths, of at least $10^{11}$ $cm^{-3}$, and preferably at least $10^{12}$ $cm^{-3}$. In IMP deposition, a separate plasma source region is formed in a region away from the wafer, for example, by inductively coupling RF power into the chamber through an electrical coil wrapped around a plasma source region between the target and the wafer. This configuration is commercially available from Applied Materials of Santa Clara, Calif. as the HDP PVD Reactor. Other HDP sputter reactors are available. The higher power ionizes not only the argon working gas, but also significantly increases the ionization fraction of the sputtered atoms, that is, produces metal ions. The wafer either self-charges to a negative potential or is RF biased to control its DC potential. The metal ions are accelerated across the plasma sheath as they approach the negatively biased wafer. As a result, their angular distribution becomes strongly peaked in the forward direction so that they are drawn deeply into the via hole. Overhangs become much less of a problem in IMP sputtering, and bottom coverage and bottom sidewall coverage are relatively high.

IMP deposited metals, however, suffer many problems. First, HDP sputter reactors are expensive. Secondly, IMP sputtering using a remote plasma source is usually performed at a higher pressure of at least 30 milliTorr. The higher pressures and a high-density plasma produce a very large number of argon ions, which are also accelerated across the plasma sheath to the surface being sputter deposited. The high-energy argon ions cause a number of problems. The argon ion energy is dissipated as heat directly into the film being formed. Copper will dewet from tantalum nitride and other barrier materials at the elevated temperatures experienced in IMP, even at temperatures as low at 50 to 75° C. Further, the argon tends to become embedded in the developing film, which cannot be a good effect. Experimentally, it is observed that IMP deposits a copper film 36, as illustrated in the cross-sectional view of FIG. 3, having a surface morphology that is very rough or even discontinuous. Such a film does not promote hole filling, particularly when the liner is being used as the electrode for electroplating.

Another technique for depositing copper is sustained self-sputtering (SSS), as is described by Fu et al. in U.S. patent application Ser. No. 08/854,008, filed May 8, 1997 and by Fu in U.S. Ser. No. 09/373,097, filed Aug. 12, 1999, now issued as U.S. Pat. No. 6,183,614. At a sufficiently high plasma density adjacent a copper target, a sufficiently high density of copper ions develops that the copper ions will resputter the copper target with yield over unity. The supply of argon working gas can then be eliminated or at least reduced to a very low pressure while the copper plasma persists. Aluminum is not subject to SSS. Some other materials, such as Pd, Pt, Ag, and Au, can also undergo SSS.

Depositing copper by sustained self-sputtering of copper has a number of advantages. The sputtering rate in SSS tends to be high. There is a high fraction of copper ions which can be accelerated across the plasma sheath and toward a biased wafer, thus increasing the directionality of the sputter flux. Chamber pressures may be made very low, often limited by leakage of backside cooling gas, thereby reducing wafer heating from the argon ions and decreasing scattering of the metal particles by the argon. It has, however, been found that standard long-throw PVD chambers will not support SSS of copper.

Techniques and reactor structures have been developed to promote sustained self-sputtering. It has been observed that some sputter materials not subject to SSS because of sub-unity resputter yields nonetheless benefit from these same techniques and structures, presumably because of partial self-sputtering, which results in a partial self-ionized plasma (SIP). Furthermore, it is often advantageous to sputter copper with a low but finite argon pressure even though SSS without any argon working gas is achievable. Hence, SIP sputtering of copper is the preferred terminology for the more generic sputtering process involving a reduced or zero pressure of working gas so that SSS is a type of SIP.

Copper may also be deposited by chemical vapor deposition (CVD) using metallo-organic precursors, such as Cu—HFAC—VTMS, commercially available from Schumacher in a proprietary blend with additional additives under the trade name CupraSelect. A thermal CVD process may be used with this precursor, as is very well known in the art, but plasma enhanced CVD (PECVD) is also possible. The CVD process is capable of depositing a nearly conformal film even in the high aspect-ratio holes being considered here. The original concept was to CVD deposit a copper film as a thin seed layer, and then use PVD or other technique for final copper hole filling. The proposed concept was based on the expense associated with CVD processes and equipment needed for filling a relatively wide via hole of perhaps 0.25 to 0.5 μm width. However, CVD copper seed layers have been observed to be almost invariably rough. The roughness detracts from its use as a seed layer and more particularly as a reflow layer promoting the low temperature reflow of after deposited copper deep into hole. Also, the roughness indicates that a relatively thick CVD copper layer of the order of 50 nm needs to be deposited to reliably coat a continuous seed layer. For the narrower via holes now being considered, a CVD copper seed layer of the necessary thickness may nearly fill the hole anyway. However, complete fills performed by CVD tend to suffer from center seams, which may impact device reliability.

Another, combination technique uses IMP sputtering to deposit a thin copper nucleation layer, sometimes referred to as a flash deposition, and a thicker CVD copper seed layer is deposited on the IMP layer. However, as was illustrated in FIG. 3, the IMP layer 36 tends to be rough, and the CVD layer tends to conformally follow the roughened substrate. Hence, the CVD layer over an IMP layer will also be rough.

Electrochemical plating (ECP) is yet another copper deposition technique that is being developed and is likely to become the preferred commercial filling process. In this method, the wafer is immersed in a copper electrolytic bath. The wafer is electrically biased with respect to the bath, and copper electrochemically deposits on the wafer in a generally conformal process. Electroless plating techniques are also available. Electroplating and its related processes are advantageous because they can be performed with simple equipment at atmospheric pressure, the deposition rates are high, and the liquid processing is consistent with the subsequent chemical mechanical polishing.

Electroplating, however, imposes its own requirements. A copper seed and adhesion layer is required on top of the barrier layer, such as of Ta/TaN, to nucleate the electroplated copper and adhere it to the barrier material. Furthermore, the generally insulating structure surrounding the via hole 22 requires that an electroplating electrode be formed between the dielectric layer 14 and the via hole 22. Tantalum and other barrier materials are typically relatively poor electrical conductors, and the usual nitride sublayer of the barrier layer 24 which faces the via hole 22 (containing the copper electrolyte) is even less conductive for the long transverse current paths needed in electroplating. Hence, a good conductive seed and adhesion layer must be deposited if the electroplating is to effectively fill the bottom of the via hole.

A copper seed layer deposited over the barrier layer 24 is typically used as the electroplating electrode. However, its integrity must be assured, and a continuous, smooth, and uniform film is preferred. Otherwise, the electroplating current will be directed only to the areas covered with copper or be preferentially directed to areas covered with thicker copper. Depositing the copper seed layer presents its own difficulties. An IMP deposited seed layer provides good bottom coverage in high aspect-ratio holes, but its sidewall coverage is so small that the resulting thing films can be rough to the point of discontinuity, leading to sidewall voiding. A thin CVD deposited seed is also too rough. A thicker CVD seed layer or CVD copper over IMP copper may require an excessively thick seed layer to achieve the required continuity. Also, the electroplating electrode primarily operates on the entire hole sidewalls so that high sidewall coverage is desired. Long throw provides a adequate sidewall coverage, but the bottom coverage is not sufficient.

Accordingly, a better method is desired for filling a via hole with copper.

Sputtering of copper has been observed to create problems not observed with sputtering of other electronic materials. Scattered copper atoms have been observed to diffuse much further into narrow recesses in the sputtering apparatus, especially for low-pressure SSS and SIP. Since sputtering, particularly at the high power levels associated with SSS and SIP, involves high voltages, dielectric isolators must separate the differently biased parts. These isolators tend, however, to become coated with copper during SSS sputtering and thus require frequent replacement or cleaning.

As a result, it is desired to protect such isolators from copper deposition.

A standard part of a sputtering chamber is a chamber shield which protects the chamber walls from deposition. The shield rather than the wall is coated and is much more easily removed or cleaned when the sputter coating builds up to excessive thickness. Typically, the shield is metallic and is electrically grounded to act as the grounding plane for the cathode target. However, it has become known that an auxiliary electrically floating shield placed around the upper part of the chamber near the target allows for sputtering at lower pressure. Such a floating shield has typically been simply supported on a shield isolator without any clamping. However, an unclamped shield introduces additional mechanical motion during the thermal cycling, which impacts the tolerances required of plasma dark spaces and proper target biasing. Shield flexing may cause excessive particulate flaking. Improper gaps and configurations between the shields and isolators cause electrical shorts. If the unclamped shield has moved during thermal cycling, there often is no assurance that it returns to its original position upon cooling so that on the next cycle it may be even further askew.

For these reasons, better alignment is desired for unclamped shields.

Plasma sputtering at low pressures, particularly those associated with SIP and SSS, may introduce a problem with igniting the plasma. Ignition of the plasma involves a different set of conditions than does its continued excitation. Often, a higher-pressure working gas, such as argon, needs to be admitted to the chamber to produce ignition. However, the film sputter coated in the presence of a larger amount of argon is not likely to conform to the type of film desired in low-pressure sputtering. Furthermore, igniting the plasma can be problematical resulting in long and undependable ignition sequences.

Accordingly, it is desired to provide better ignition of plasma for low-pressure sputtering, particularly of copper.

SUMMARY OF THE INVENTION

The invention may be summarized as a method of sputter depositing copper combining long-throw sputtering with self-ionized plasma (SIP) sputtering. Long-throw sputtering is characterized by a relatively high ratio of the target-to-substrate distance and the substrate diameter. Long-throw SIP sputtering promotes deep hole coating of both the ionized and neutral copper components.

SIP is promoted by low pressures of less than 5 milliTorr, preferably less than 2 milliTorr, and more preferably less than 1 milliTorr. SIP, particularly at these low pressures, is promoted by magnetrons having relatively small areas to thereby increase the target power density, and by magnetrons having asymmetric magnets causing the magnetic field to penetrate far toward the substrate. SIP is also promoted by an electrically floating sputtering shield extending relatively far away from the target, preferably in the range of 6 to 10 cm. Advantageously, a first narrow convolute channel is formed between the floating shield and a grounded shield and a second narrow convolute channel is formed between the floating shield and the target. Such channels prevent copper or other metal atoms ions from penetrating to the area of dielectric spacers and O-rings separating the target, the floating shield, and the grounded shield. The widths of such channels are preferably in the range of 100 to 120 mils (2.5 to 3 mm). The aspect ratio of the bottom cylindrical portion of the channel between the two shields preferably has an aspect ratio of at least 4:1, more preferably at least 8:1. The channels preferably include two 90° turns.

Accordingly to one aspect of the invention, the sputtering conditions are controlled to provide a balance between SIP and conventional sputtering using a working gas to thereby control the ratio of copper ions and neutral copper atoms in the sputter flux.

The invention may be used to deposit a copper seed layer, promoting the nucleation or seeding of an after deposited layer, particularly useful for forming narrow and deep vias or contacts through a dielectric layer. The second copper layer may be deposited by electrochemical plating (ECP).

In another embodiment of the inventive process for filling the hole, the second copper layer is be deposited by chemical vapor deposition (CVD). The CVD layer may itself be used as a seed layer for subsequent ECP, or the CVD layer may completely fill the hole, especially for very high aspect-ratio holes.

In yet another embodiment of the inventive process for forming a copper seed layer, a first step deposits a portion of a thin copper seed layer in a high-density plasma in a process referred to as ionized metal plating (IMP), and a second step deposits another portion of the copper seed layer in a SIP process.

Another aspect of the invention involves the chamber shields. A longer floating shield promotes plasma ignition. Furthermore, a narrow convolute channel is preferably formed between the floating and grounded shields, whereby isolators involved with supporting and isolating the shields are protected from being coated with the sputtered metal. Centering means keep an electrically and mechanically floating shield aligned through the temperature cycling. Barriers are formed between the processing volume and sliding surfaces existing between the isolator, the floating shield, and the support surfaces.

Yet another aspect of the invention involves the ignition sequence. Preferably, the plasma is ignited at a relatively high pressure of the working gas but at a reduced target power level. After plasma ignition, the chamber pressure is reduced and the target power is increased to their operational sputtering levels.

DETAILED DESCRIPTION OF THE PREFERRED EMBODIMENTS

Figure 1:
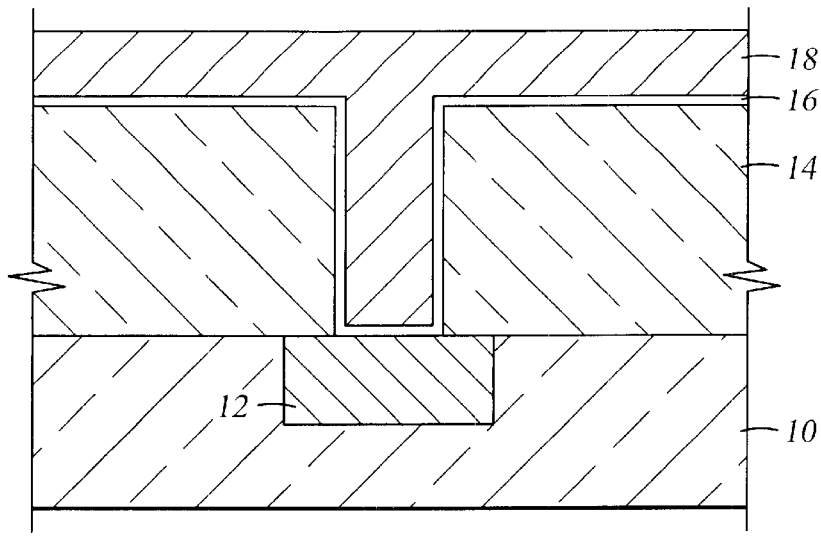
FIG. 1 is a cross-sectional view of a via filled with a metallization, which also covers the top of the dielectric, as practiced in the prior art.
Figure 2:
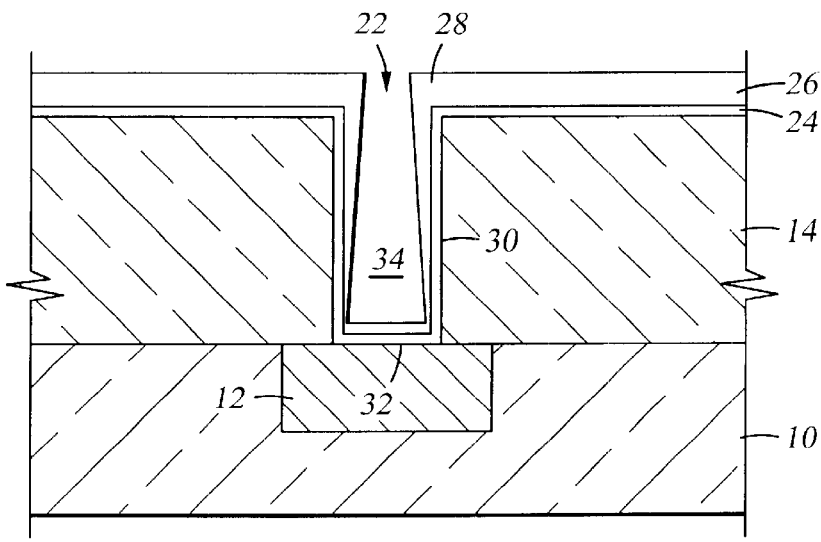
FIG. 2 is a cross-sectional view of a via during its filling with metallization, which overhangs and closes off the via hole.
Figure 3:
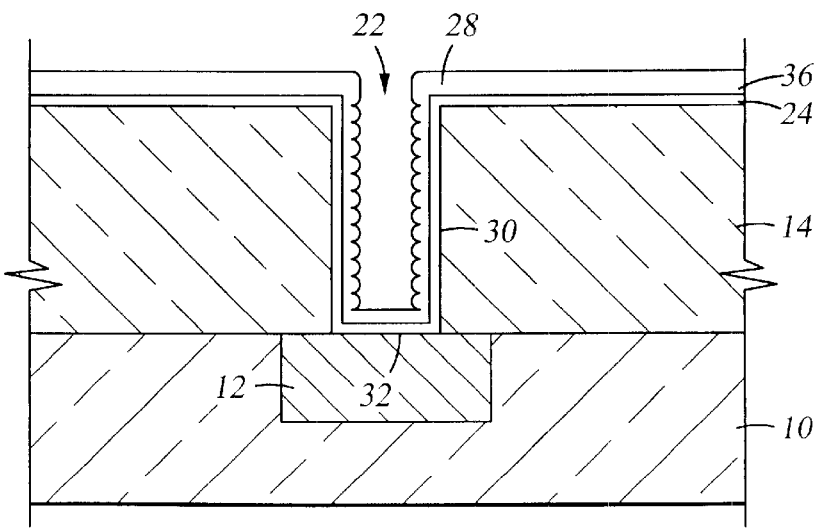
FIG. 3 is a cross-sectional view of a via having a rough seed layer deposited by ionized metal plating.

The distribution between ionized and neutral atomic flux in a DC magnetron sputtering reactor can be tailored to produce a smooth conformal copper liner in a hole in a dielectric layer, either by itself or in combination with a copper seed layer deposited by chemical vapor deposition (CVD) over a sputtered copper nucleation layer. The copper liner layer is particularly useful as a thin seed layer for electroplated copper.

The DC magnetron sputtering reactors of the prior art have been directed to either conventional, working gas sputtering or to sustained self-sputtering. The two approaches emphasize different types of sputtering. It is, on the other hand, preferred that the reactor for the copper liner combine various aspects of the prior art to control the distribution between ionized copper atoms and neutrals. An example of such a reactor 50 is illustrated in the schematic cross-sectional view of FIG. 4. This reactor is based on a modification of the Endura PVD Reactor available from Applied Materials, Inc. of Santa Clara, Calif. The reactor 50 includes a vacuum chamber 52, usually of metal and electrically grounded, sealed through a target isolator 54 to a PVD target 56 having at least a surface portion composed of the material, in this case copper or a copper alloy, to be sputter deposited on a wafer 58. The alloying element is typically present to less than 5 wt %, and essentially pure copper may be used if adequate barriers are otherwise formed. A wafer clamp 60 holds the wafer 58 on a pedestal electrode 62. Unillustrated resistive heaters, refrigerant channels, and thermal transfer gas cavity in the pedestal 62 allow the temperature of the pedestal to be controlled to temperatures of less than −40° C. to thereby allow the wafer temperature to be similarly controlled.

A floating shield 64 and a grounded shield 66 separated by a second dielectric shield isolator 68 are held within the chamber 52 to protect the chamber wall 52 from the sputtered material. The grounded shield 66 also acts as the anode grounding plane in opposition to the cathode target 56, thereby capacitively supporting a plasma. Some electrons deposit on the floating shield 64 so that a negative charge builds up there. The negative potential not only repels further electrons from being deposited, but also confines the electrons in the main plasma area, thus reducing the electron loss, sustaining low-pressure sputtering, and increasing the plasma density.

Figure 5:
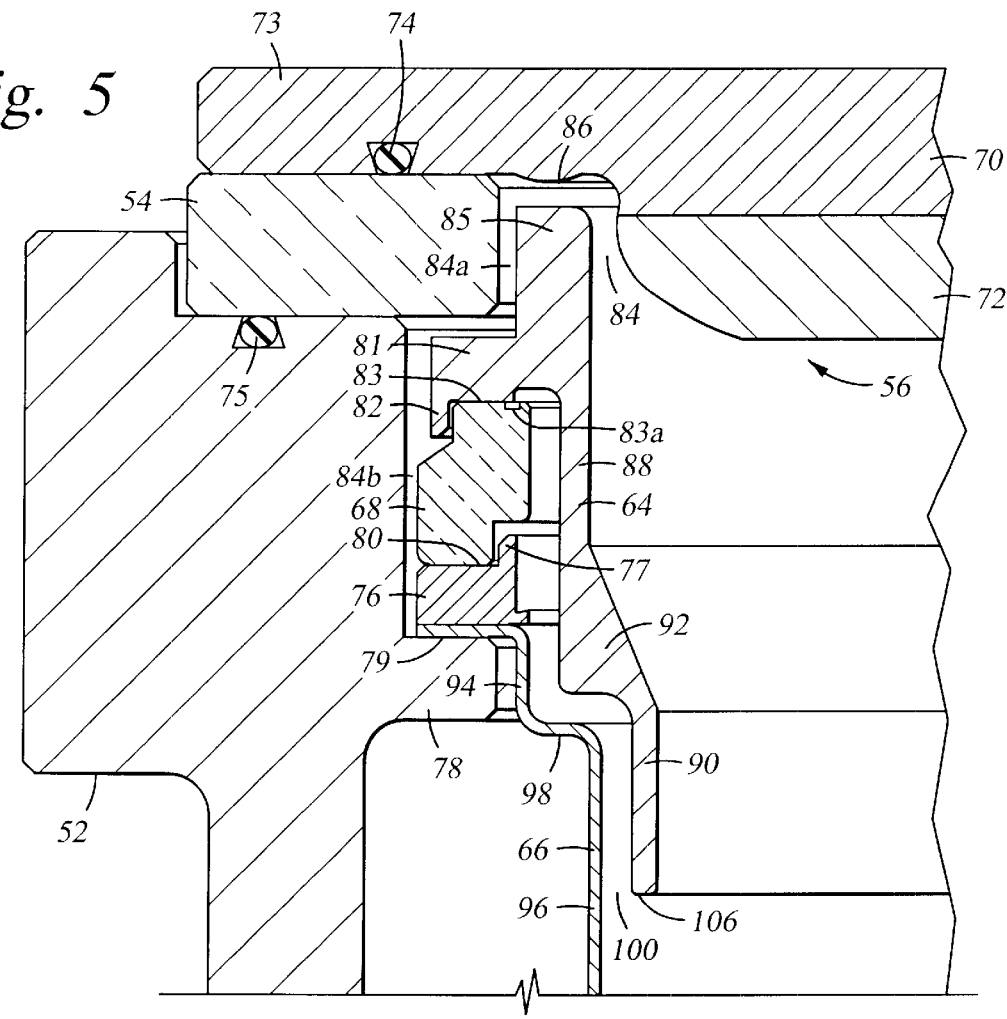
FIG. 5 is an exploded view of a portion of FIG. 4 detailing the target, shields, isolators and target O-ring.

Details of the target and shields are illustrated in the exploded cross-sectional view of FIG. 5. The target 56 includes an aluminum or titanium backing plate 70 to which is soldered or diffusion bonded a copper target portion 72. A flange 73 of the backing plate 70 rests on and is vacuum sealed through a polymeric target O-ring 74 to the target isolator 54, which is preferably composed of a ceramic such as alumina. The target isolator 54 rests on and is vacuum sealed through an adaptor O-ring 75 to the chamber 52, which in fact may be an aluminum adaptor sealed to the main chamber body. A metal clamp ring 76 has on its inner radial side an upwardly extending annular rim 77. Unillustrated bolts fix the metal clamp ring 76 to an inwardly extending ledge 78 of the chamber 52 and capture a flange 79 of the grounded shield 66. Thereby, the grounded shield 66 is mechanically and electrically connected to the grounded chamber 52.

The shield isolator 68 freely rests on the clamp ring 76 and may be machined from a ceramic material such as alumina. It is compact but has a relatively large height of approximately 165 mm compared to a smaller width to provide strength during the temperature cycling of the reactor. The lower portion of the shield isolator 68 has an inner annular recess fitting outside of the rim 77 of the clamp ring 76. The rim 77 not only acts to center the inner diameter of the shield isolator 68 with respect to the clamp ring 76 but also acts as a barrier against any particles generated at the sliding surface 80 between the ceramic shield isolator 68 and the metal ring clamp 76 from reaching the main processing area.

A flange 81 of the floating shield 64 freely rests on the shield isolator 68 and has a tab or rim 82 on its outside extending downwardly into an annular recess formed at the upper outer corner of the shield isolator 68. Thereby, the tab 82 centers the floating shield 64 with respect to the target 56 at the outer diameter of the shield isolator 68. The shield tab 82 is separated from the shield isolator 68 by a narrow gap which is sufficiently small to align the plasma dark spaces but sufficiently large to prevent jamming of the shield isolator 68, and the floating shield 81 rests on the shield isolator 68 in a sliding contact area 83 inside and above the tab 82.

A narrow channel 84 is formed between a head 85 of the floating shield 64 and the target 56. It has a width of about 2 mm to act as a plasma dark space. The narrow channel 84 continues in a path extending even more radially inward than illustrated past a downwardly projecting ridge 86 of the backing plate flange 74 to an upper back gap 84a between the shield head 85 and the target isolator 54. The structure of these elements and their properties are similar to those disclosed by Tang et al. in U.S. patent application Ser. No. 09/191,253, filed Oct. 30, 1998. The upper back gap 84a has a width of about 1.5 mm at room temperature. When the shield elements are temperature cycled, they tend to deform. The upper back gap 84a, having a smaller width than the narrow channel 84 next to the target 56, is sufficient to maintain a plasma dark space in the narrow channel 84. The back gap 84a continues downwardly into a lower back gap 84b between the shield isolator 68 and the ring clamp 76 on the inside and the chamber body 52 on the outside. The lower back gap 84b serves as a cavity to collect ceramic particles generated at the sliding surfaces 80, 83 between the ceramic shield isolator 68 and the clamp ring 76 and the floating shield 64. The shield isolator 68 additionally includes a shallow recess 83a on its upper inner corner to collect ceramic particles from the sliding surface 83 on its radially inward side.

The floating shield 64 includes a downwardly extending, wide upper cylindrical portion 88 extending downwardly from the flange 81 and connected on its lower end to a narrower lower cylindrical portion 90 through a transition portion 92. Similarly, the grounded shield 66 has an wider upper cylindrical portion 94 outside of and thus wider than the upper cylindrical portion 88 of the floating shield 64. The grounded upper cylindrical portion 94 is connected on its upper end to the grounded shield flange 80 and on its lower end to a narrowed lower cylindrical portion 96 through a transition portion 98 that approximately extends radially of the chamber. The grounded lower cylindrical portion 96 fits outside of and is thus wider than the floating lower cylindrical portion 90; but, it is smaller than the floating upper cylindrical portion 64 by a radial separation of about 3 mm. The two transition portions 92, 98 are both vertically and horizontally offset. A labyrinthine narrow channel 100 is thereby formed between the floating and grounded shields 64, 66 with the offset between the grounded lower cylindrical portion 96 and floating upper cylindrical portion 64 assuring no direct line of sight between the two vertical channel portions. A purpose of the channel 100 is to electrically isolate the two shields 64, 66 while protecting the clamp ring 76 and the shield isolator 68 from copper deposition.

The lower portion of the channel 100 between the lower cylindrical portions 90, 96 of the shields 64, 66 has an aspect ratio of 4:1 or greater, preferably 8:1 or greater. The lower portion of the channel 100 has an exemplary width of 0.25 cm and length of 2.5 cm, with preferred ranges being 0.25 to 0.3 cm and 2 to 3 cm. Thereby, any copper ions and scattered copper atoms penetrating the channel 100 are likely to have to bounce several times from the shields and at least be stopped by the upper grounded cylindrical portion 94 before they can find their way further toward the clamp ring 76 and the shield isolator 68. Any one bounce is likely to result in the ion being absorbed by the shield. The two adjacent 90° turns or bends in the channel 100 between the two transition portions 92, 98 further isolate the shield isolator 68 from the copper plasma. A similar but reduced effect could be achieved with 60° bends or even 45° bends but the more effective 90° bends are easier to form in the shield material. The 90° turns are much more effective because they increase the probability that copper particles coming from any direction will have at least one high angle hit and thereby lose most their energy to be stopped by the upper grounded cylindrical portion 94. The 90° turns also shadow the clamp ring 76 and shield isolator 68 from being directly irradiated by copper particles. It has been found that copper preferentially deposits on the horizontal surface at the bottom of the floating transition portion 92 and on the vertical upper grounded cylindrical portion 94, both at the ends of one of the 90° turns. Also, the convolute channel 100 collects ceramic particles generated from the shield isolator 68 during processing on the horizontal transition portion 98 of the grounded shield 66. It is likely that such collected particles are pasted by copper also collected there.

Figure 4:
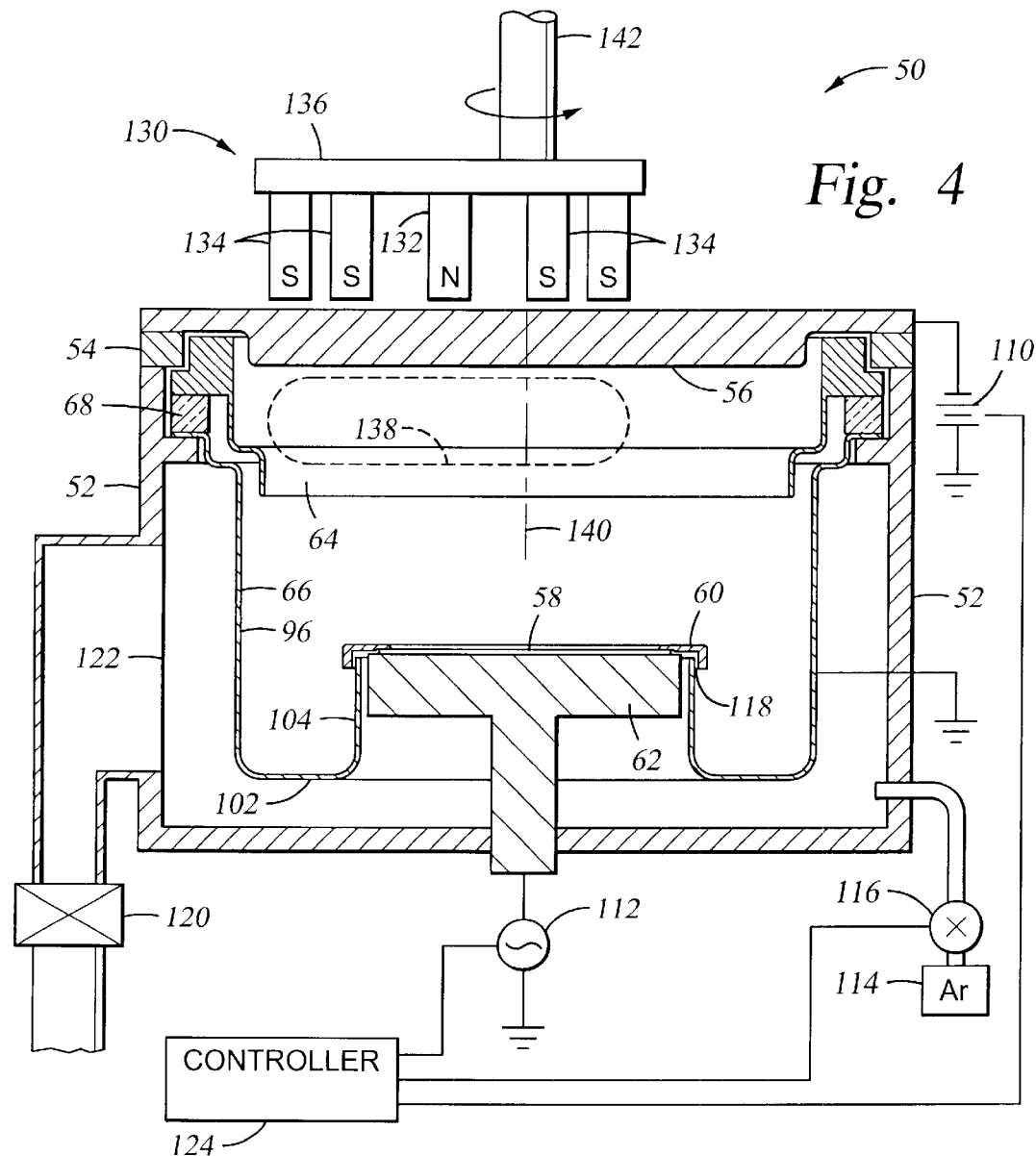
FIG. 4 is a schematic representation of a sputtering chamber usable with the invention.

Returning to the large view of FIG. 4, the lower cylindrical portion 96 of the grounded shield 66 continues downwardly to well in back of the top of the pedestal 62 supporting the wafer 58. The grounded shield 66 then continues radially inwardly in a bowl portion 102 and vertically upwardly in an innermost cylindrical portion 104 to approximately the elevation of the wafer 58 but spaced radially outside of the pedestal 62.

The shields 64, 66 are typically composed of stainless steel, and their inner sides may be bead blasted or otherwise roughened to promote adhesion of the copper sputter deposited on them. At some point during prolonged sputtering, however, the copper builds up to a thickness that it is likely to flake off, producing deleterious particles. Before this point is reached, the shields should be cleaned or more likely replaced with fresh shields. However, the more expensive isolators 54, 68 do not need to be replaced in most maintenance cycles. Furthermore, the maintenance cycle is determined by flaking of the shields, not by electrical shorting of the isolators.

Figure 6:
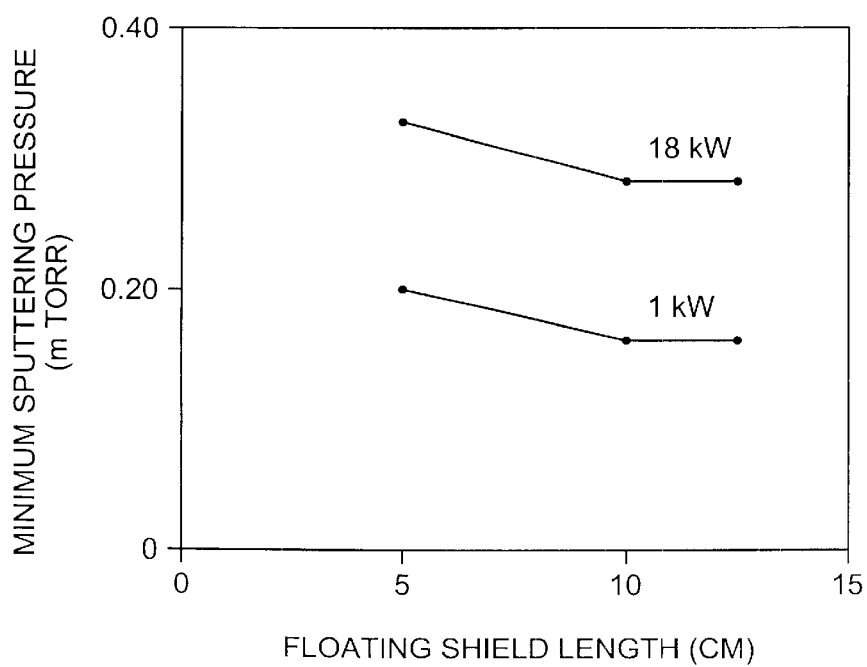
FIG. 6 is a graph illustrating the relationship between the length of the floating shield and the minimum pressure for supporting a plasma.

As mentioned, the floating shield 64 accumulates some electron charge and builds up a negative potential. Thereby, it repels further electron loss to the floating shield 64 and thus confines the plasma nearer the target 56. Ding et al. have disclosed a similar effect with a somewhat similar structure in U.S. Pat. No. 5,736,021. However, the floating shield 64 of FIG. 5 has its lower cylindrical portion 90 extending much further away from the target 56 than does the corresponding part of Ding et al., thereby confining the plasma over a larger volume. However, the floating shield 64 electrically shields the grounded shield 66 from the target 56 so that is should not extend too far away from the target 56. If it is too long, it becomes difficult to strike the plasma; but, if it is too short, electron loss is increased so that the plasma cannot be sustained at lower pressure and the plasma density falls. An optimum length has been found at which the bottom tip 106 of the floating shield 66, as shown in FIG. 5, is separated 6 cm from the face of the target 56 with a total axial length of the floating shield 66 being 7.6 cm. Three different floating shields have been tested for the minimum pressure at which copper sputtering is maintained. The results are shown in FIG. 6 for 1 kW and 18 kW of target power. The abscissa is expressed in terms of total shield length, the separation between shield tip 106 and target 56 being 1.6 cm less. A preferred range for the separation is 5 to 7 cm, and that for the length is 6.6 to 8.6 cm. Extending the shield length to 10 cm reduces the minimum pressure somewhat but increases the difficulty of striking the plasma.

Referring again to FIG. 4, a selectable DC power supply 110 negatively biases the target 56 to about −400 to −600 VDC with respect to the grounded shield 66 to ignite and maintain the plasma. A target power of between 1 and 5 kW is typically used to ignite the plasma while a power of greater than 10 kW is preferred for the SIP sputtering described here. Conventionally, the pedestal 62 and hence the wafer 58 are left electrically floating, but a negative DC self-bias nonetheless develops on it. On the other hand, some designs use a controllable power supply 112 to apply a DC or RF bias to the pedestal 62 to further control the negative DC bias that develops on it. In the tested configuration, the bias power supply 112 is an RF power supply operating at 13.56 MHz. It may be supplied with up to 600W of RF power, a preferred range being 350 to 550W for a 200 mm wafer.

A gas source 114 supplies a sputtering working gas, typically the chemically inactive noble gas argon, to the chamber 52 through a mass flow controller 116. The working gas can be admitted to the top of the chamber or, as illustrated, at its bottom, either with one or more inlet pipes penetrating apertures through the bottom of the shield grounded shield 66 or through a gap 118 between the grounded shield 66, the wafer clamp 60, and the pedestal 62. A vacuum pump system 120 connected to the chamber 52 through a wide pumping port 122 maintains the chamber at a low pressure. Although the base pressure can be held to about $10^{-7}$ Torr or even lower, the pressure of the working gas is typically maintained at between about 1 and 1000 milliTorr in conventional sputtering and to below about 5 milliTorr in SIP sputtering. A computer-based controller 124 controls the reactor including the DC target power supply 110, the bias power supply 112, and the mass flow controller 116.

To provide efficient sputtering, a magnetron 130 is positioned in back of the target 56. It has opposed magnets 132, 134 connected and supported by a magnetic yoke 136. The magnets creates a magnetic field adjacent the magnetron 130 within the chamber 52. The magnetic field traps electrons and, for charge neutrality, the ion density also increases to form a high-density plasma region 138. The magnetron 130 is usually rotated about the center 140 of the target 56 by a motor-driven shaft 142 to achieve full coverage in sputtering of the target 56. To achieve a high-density plasma 138 of sufficient ionization density to allow sustained self-sputtering of copper, the power density delivered to the area adjacent the magnetron 130 must be made high. This can be achieved, as described by Fu in the above cited patents, by increasing the power level delivered from the DC power supply 110 and by reducing the area of magnetron 130, for example, in the shape of a triangle or a racetrack. A 60° triangular magnetron, which is rotated with its tip approximately coincident with the target center 140, covers only about ⅙ of the target at any time. Coverage of ¼ is the preferred maximum in a commercial reactor capable of SIP sputtering.

To decrease the electron loss, the inner magnetic pole represented by the inner magnet 132 and unillustrated magnetic pole face should have no significant apertures and be surrounded by a continuous outer magnetic pole represented by the outer magnets 134 and unillustrated pole face. Furthermore, to guide the ionized sputter particles to the wafer 58, the outer pole should produce a much higher magnetic flux than the inner pole. The extending magnetic field lines trap electrons and thus extend the plasma closer to the wafer 58. The ratio of magnetic fluxes should be at least 150% and preferably greater than 200%. Two embodiments of Fu's triangular magnetron have 25 outer magnets and 6 or 10 inner magnets of the same strength but opposite polarity.

When the argon is admitted into the chamber, the DC voltage difference between the target 56 and the grounded shield 66 ignites the argon into a plasma, and the positively charged argon ions are attracted to the negatively charged target 56. The ions strike the target 56 at a substantial energy and cause target atoms or atomic clusters to be sputtered from the target 56. Some of the target particles strike the wafer 58 and are thereby deposited on it, thereby forming a film of the target material. In reactive sputtering of a metallic nitride, nitrogen is additionally admitted into the chamber, and it reacts with the sputtered metallic atoms to form a metallic nitride on the wafer 58.

The illustrated chamber is capable of self-ionized sputtering of copper including sustained self-sputtering. In this case, after the plasma has been ignited, the supply of argon may be cut off in the case of SSS, and the copper ions have sufficiently high density to resputter the copper target with a yield of greater than unity. Alternatively, some argon may continue to be supplied, but at a reduced flow rate and chamber pressure and perhaps with insufficient target power density to support pure sustained self-sputtering but nonetheless with a significant but reduced fraction of self-sputtering. If the argon pressure is increased to significantly above 5 milliTorr, the argon will remove energy from the copper ions, thus decreasing the self-sputtering. The wafer bias attracts the ionized fraction of the copper particle deep into the hole.

However, to achieve deeper hole coating with a partially neutral flux, it is desirable to increase the distance between the target 56 and the wafer 58, that is, to operate in the long-throw mode. In long-throw, the target-to-substrate spacing is greater than half the substrate diameter, preferably greater than wafer diameter, more preferably at least 80% of the substrate diameter, and most preferably least 140% of the substrate diameter. The throws mentioned in the examples of the embodiment are referenced to 200 mm wafers. Long throw in conventional sputtering reduces the sputtering deposition rate, but ionized sputter particles do not suffer such a large decrease.

The controlled division between conventional (argon-based) sputtering and sustained self-sputtering (SSS) allows the control of the distribution between neutral and ionized sputter particles. Such control is particularly advantageous for the sputter deposition of a copper seed layer in a high aspect-ratio via hole. The control of the ionization fraction of sputtered atoms is referred to as self-ionized plasma (SIP) sputtering.

Figure 7:
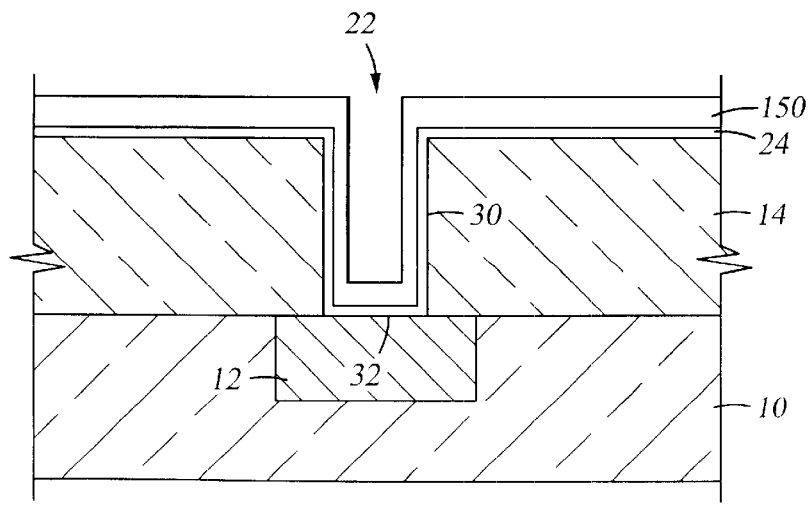
FIG. 7 is a cross-sectional view of via metallization according to one embodiment of the invention.

One embodiment of a structure produced by the invention is a via illustrated in cross-section in FIG. 7. A seed copper layer 150 is deposited in the via hole 22 over the barrier layer 24 using, for example, the long-throw sputter reactor of FIG. 4 and under conditions promoting SIP. The SIP copper layer 150 may be deposited, for example, to a blanket thickness of 50 to 300 nm or more preferably of 80 to 200 nm. The SIP copper seed layer 150 preferably has a thickness in the range of 2 to 20 nm on the via sidewalls, more preferably 7 to 15 nm. In view of the narrow holes, the sidewall thickness should not exceed 50 nm. The quality of the film is improved by decreasing the pedestal temperature to less than 0° C. and preferably to less than −40° C. so that the coolness afforded by the quick SIP deposition becomes important.

The SIP copper seed layer 150 has good bottom coverage and enhanced sidewall coverage. It has been experimentally observed to be much smoother than either IMP or CVD copper deposited directly over the barrier layer 24. After the conformal copper seed layer 150 is deposited, the hole is filled with a copper layer 18, as in FIG. 1, preferably by electrochemical plating using the seed layer 150 as one of the electroplating electrodes. However, the smooth structure of the SIP copper seed layer 150 also promotes reflow or higher-temperature deposition of copper by standard sputtering or physical vapor deposition (PVD).

Several experiments were performed in SIP depositing such a seed layer into a 0.20 μm-wide via hole in 1.2 μm of oxide. With a target-to-substrate spacing of 290 mm, a chamber pressure of less than 0.1 milliTorr (indicating SSS mode) and 14 kW of DC power applied to the target with a 60° triangular magnetron, a deposition producing 0.2 μm of blanket thickness of the copper on top of the oxide produces 18 nm on the via bottom and about 12 nm on the via sidewalls. Deposition times of 30 s and less are typical. When the target power is increased to 18 kW, the bottom coverage increases to 37 nm without a significant change in sidewall thickness. The higher bottom coverage at higher power indicates a higher ionization fraction. For both cases, the deposited copper film is observed to be much smoother than seen for IMP or CVD copper.

The SIP deposition is relatively fast, between 0.5 to 1.0 μm/min in comparison to an IMP deposition rate of no more than 0.2 μm/min. The fast deposition rate results in a short deposition period and, in combination with the absence of argon ion heating, significantly reduces the thermal budget. It is believed that the low-temperature SIP deposition results in a very smooth copper seed layer.

Figure 8:
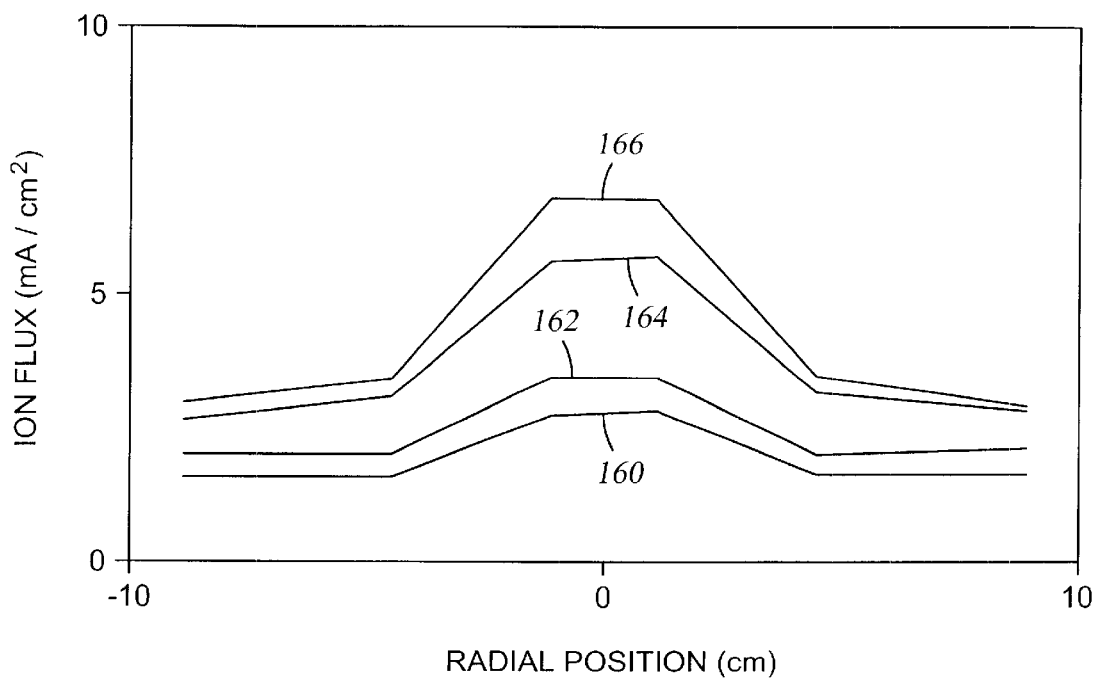
FIGS. 8 and 9 are graphs plotting ion current flux across the wafer for two different magnetrons and different operating conditions.

A 290 mm throw was used with the standard triangular magnetron of Fu utilizing ten inner magnets and twenty-five outer ones. The ion current flux was measured as a function of radius from the target center under various conditions. The results are plotted in the graph of FIG. 8. Curve 160 is measured for 16 kW of target power and 0 milliTorr of chamber pressure. Curves 162, 164, 164 are measured for 18 kW of target power and chamber pressures of 0, 0.2, and 1 milliTorr respectively. These currents correspond to an ion density of between $10^{11}$ and $10^{12}$ cm$^{-3}$, as compared to less than $10^9$ cm$^{-3}$ with a conventional magnetron and sputter reactor. The zero-pressure conditions were also used to measure the copper ionization fraction. The spatial dependences are approximately the same with the ionization fraction varying between about 10% and 20% with a direct dependence on the DC target power. The relatively low ionization fraction demonstrate that SIP without long throw would has a large fraction of neutral copper flux which would have the unfavorable deep filling characteristics of conventional PVD. Results indicate that operation at higher power is preferred for better step coverage due to the increased ionization.

Figure 9:
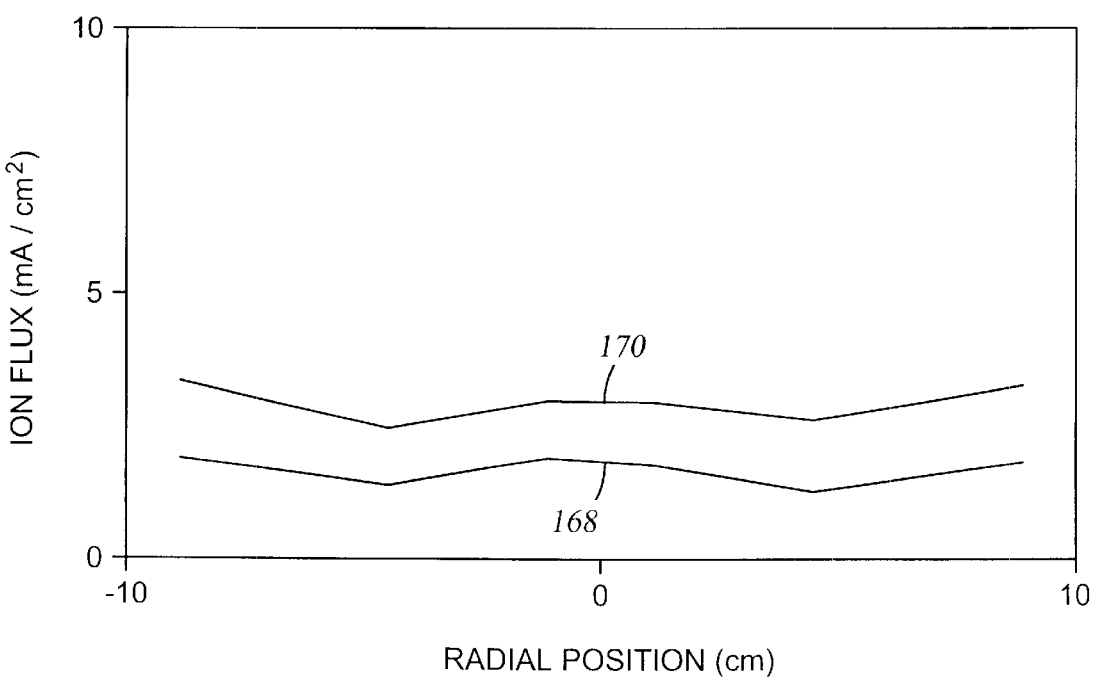

The tests were then repeated with the number of inner magnets in the Fu magnetron being reduced to six. That is, the second magnetron had improved uniformity in the magnetic flux, which promotes a uniform sputtered ion flux toward the wafer. The results are plotted in FIG. 9. Curve 168 displays the ion current flux for 12 kW of target power and 0 milliTorr pressure; curve 170, for 18 kW. Curves for 14 kW and 16 kW are intermediate. Thus, the modified magnetron produces a more uniform ion current across the wafer, which is again dependent on the target power with higher power being preferred.

The relatively low ionization fractions of 10% to 20% indicate a substantial flux of neutral copper compared to the 90% to 100% fraction of IMP. While wafer bias can guide the copper ions deep into the holes, long throw accomplishes much the same for the copper neutrals.

A series of tests were used to determine the combined effects of throw and chamber pressure upon the distribution of sputter particles. At zero chamber pressure, a throw of 140 mm produces a distribution of about ±45°; a throw of 190 mm, about ±35°; and, a throw of 290 mm, about ±25°. The pressure was varied for a throw of 190 mm. The central distribution remains about the same for 0, 0.5 and 1 milliTorr. However, the low-level tails are pushed out almost 10° for the highest pressure, indicative of the scattering of some particles. These results indicate that acceptable results are obtained below 5 milliTorr, but a preferred range is less than 2 milliTorr, a more preferred range is less than 1 milliTorr, and a most preferred range is 0.2 milliTorr and less. Also, as expected, the distribution is best for the long throws.

A SIP film deposited into a high-aspect ratio hole has favorable upper sidewall coverage and tends not to develop overhangs. On the other hand, an IMP film deposited into such a hole has better bottom and bottom corner coverage, but the sidewall film tends to have poor coverage and be rough. The advantages of both types of sputtering can be combined by using a two-step copper seed sputter deposition. In a first step, copper is deposited in an IMP reactor producing a high-density plasma, for example, by the use of RF inductive source power. Exemplary deposition conditions are 20 to 60 milliTorr of pressure, 1 to 3 kW of RF coil power, 1 to 2 kW of DC target power, and 150W of bias power. The first step provides good though rough bottom and bottom sidewall coverage. In a second and preferably subsequent step, copper is deposited in a SIP reactor of the sort described above producing a lesser degree of copper ionization. Exemplary deposition conditions are 1 Torr pressure, 18 to 24 kW of DC target power and 500W of bias power. The second step provides good smooth upper sidewall coverage and further smooths out the already deposited IMP layer. The blanket deposition thicknesses for the two steps preferably range from 50 to 100 nm for the IMP deposition and 100 to 200 nm for the SIP layer. Blanket thicknesses may be a ratio of 30:70 to 70:30. Alternatively, the SIP layer can be deposited before the IMP layer. After the copper seed layer is sputter deposited by the two-step process, the remainder of the hole is filled, for example, by electroplating.

Figure 10:
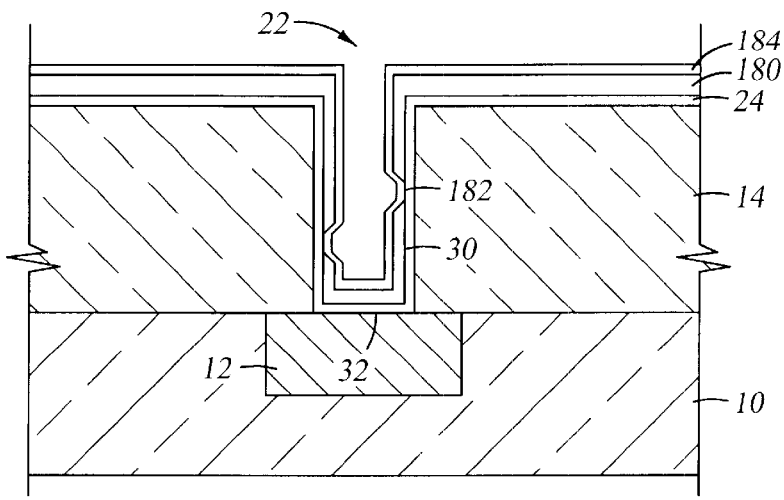
FIG. 10 is a cross-sectional view of a via metallization according to a second embodiment of the invention.

The SIP sidewall coverage may become a problem for very narrow, high-aspect ratio vias. Technology for 0.13 $\mu$m vias and smaller is being developed. Below about 110 nm of blanket thickness, the sidewall coverage may become discontinuous. As shown in the cross-sectional view of FIG. 10, the unfavorable geometry may cause a SIP copper film 180 to be formed as a discontinuous films including voids or other imperfections 182 on the via sidewall 30. The imperfection 182 may be an absence of copper or such a thin layer of copper that it cannot act locally as an electroplating cathode. Nonetheless, the SIP copper film 180 is smooth apart from the imperfections 182 and well nucleated. In these challenging geometries, it is then advantageous to deposit a copper CVD seed layer 184 over the SIP copper nucleation film 180. Since it is deposited by chemical vapor deposition, it is generally conformal and is well nucleated by the SIP copper film 180. The CVD seed layer 184 patches the imperfections 182 and presents a continuous, non-rough seed layer for the later copper electroplating to complete the filling of the hole 22. The CVD layer may be deposited in a CVD chamber designed for copper deposition, such as the CuxZ chamber available from Applied Materials using the previously described thermal process.

Experiments were performed in which 20 nm of CVD copper was deposited on alternatively a SIP copper nucleation layer and an IMP nucleation layer. The combination with SIP produced a relatively smooth CVD seed layer while the combination with IMP produced a much rougher surface in the CVD layer to the point of discontinuity. The CVD layer 184 may be deposited to a thickness, for example, in the range of 5 to 20 nm. The remainder of the hole may then be filled with copper by other methods. The very smooth seed layer produced by CVD copper on top of the nucleation layer of SIP copper provides for efficient hole filling of copper by electroplating or conventional PVD techniques in the narrow vias being developed. In particular for electroplating, the smooth copper nucleation and seed layer provides a continuous and nearly uniform electrode for powering the electroplating process.

Figure 11:
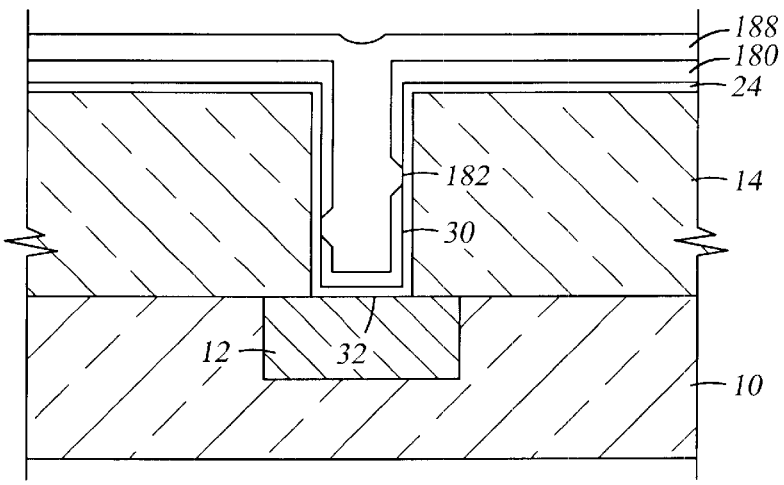
FIG. 11 is a cross-sectional view of a via metallization according to a third embodiment of the invention.

In the filling of a via or other hole having a very high-aspect ratio, it may be advantageous to dispense with the electroplating and instead, as illustrated in the cross-sectional view of FIG. 11, deposit a sufficiently thick CVD copper layer 188 over the SIP copper nucleation layer 180 to completely fill the via. An advantage of CVD filling is that it eliminates the need for a separate electroplating step. Also, electroplating requires fluid flows which may be difficult to control at hole widths below 0.13 $\mu$m.

An advantage of the copper bilayer of this embodiment of the invention is that it allows the copper deposition to be performed with a relatively low thermal budget. Tantalum tends to dewet from oxide at higher thermal budgets. IMP has many of the same coverage advantages for deep hole filling, but IMP tends to operate at a much higher temperature because it produces a high flux of energetic argon ions which dissipate their energy in the layer being deposited. Further, IMP invariably implants some argon into the deposited film. On the contrary, the relatively thin SIP layer is deposited at a relatively high rate and the SIP process is not inherently hot because of the absence of argon. Also, the SIP deposition rates are much faster than with IMP so that any hot deposition is that much shorter, by up to a factor of a half.

Figure 12:
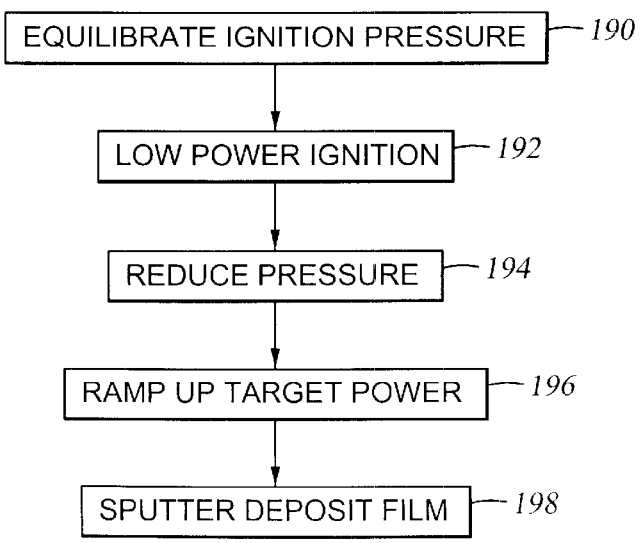
FIG. 12 is a flow diagram of a plasma ignition sequence which reduces heating of the wafer.

The thermal budget is also reduced by a cool ignition of the SIP plasma. A cool plasma ignition and processing sequence is illustrated in the flow diagram of FIG. 12. After the wafer has been inserted through the load lock valve into the sputter reactor, the load lock valve is closed, and in step 190 gas pressures are equilibrated. The argon chamber pressure is raised to that used for ignition, typically between 2 and about 5 to 10 milliTorr, and the argon backside cooling gas is supplied to the back of the wafer at a backside pressure of about 5 to 10 Torr. In step 192, the argon is ignited with a low level of target power, typically in the range of 1 to 5 kW. After the plasma has been detected to ignite, in step 194, the chamber pressure is quickly ramped down, for example over 3 s, with the target power held at the low level. If sustained self-sputtering is planned, the chamber argon supply is turned off, but the plasma continues in the SSS mode. For self-ionized plasma sputtering, the argon supply is reduced. The backside cooling gas continues to be supplied. Once the argon pressure has been reduced, in step 196, the target power is quickly ramped up to the intended sputtering level, for example, 10 to 24 kW or greater for a 200 mm wafer, chosen for the SIP or SSS sputtering. It is possible to combine the steps 194, 196 by concurrently reducing pressure and ramping up the power. In step 198, the target continues to be powered at the chosen level for a length of time necessary to sputter deposit the chosen thickness of material. This ignition sequence is cooler than using the intended sputtering power level for ignition. The higher argon pressure facilitates ignition but would deleteriously affect the sputtered neutrals if continued at the higher power levels desired for sputter deposition. At the lower ignition power, very little copper is deposited due to the low deposition rate at the reduced power. Also, the pedestal cooling keep the wafer chilled through the ignition process.

Figure 13:
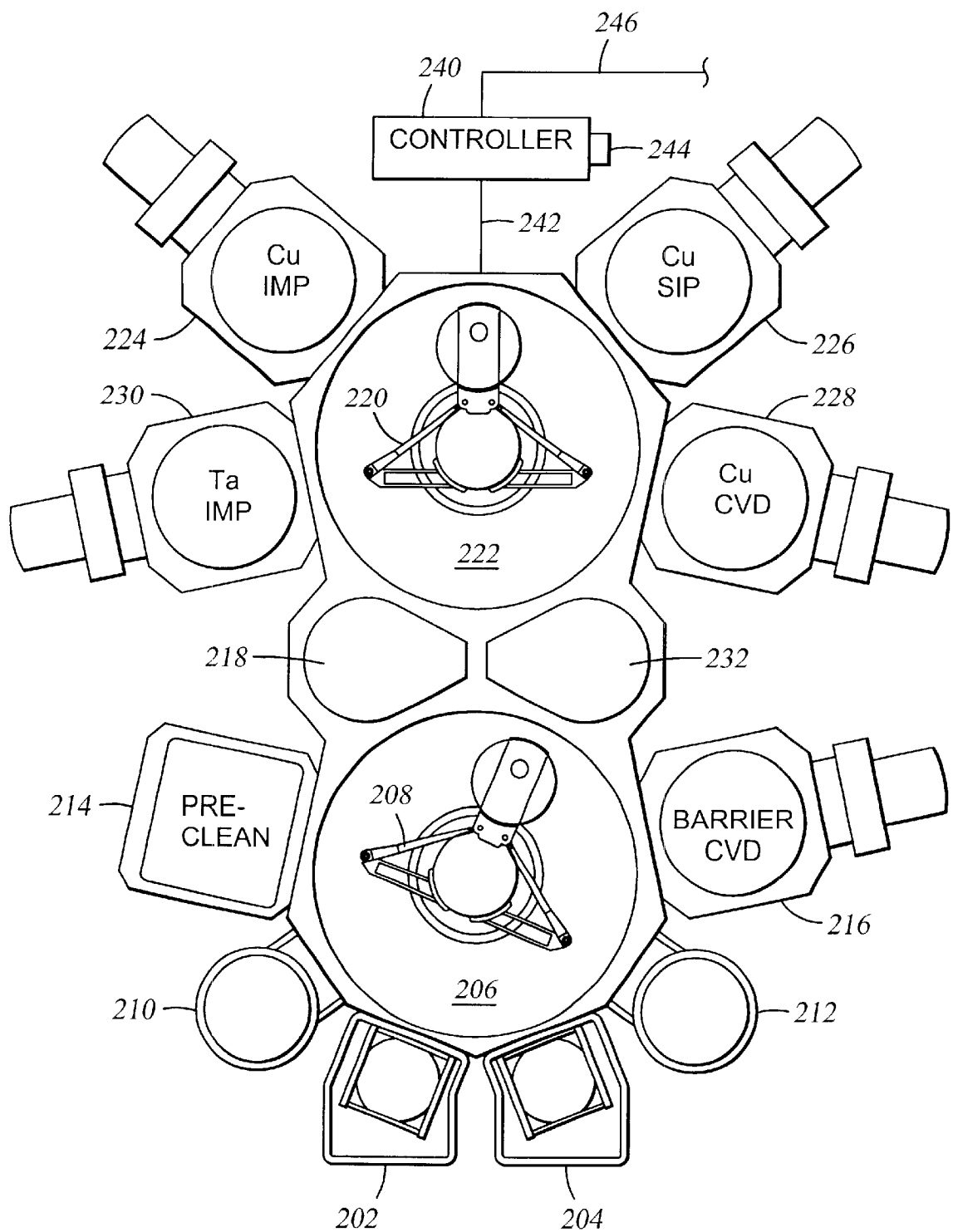
FIG. 13 is a schematic view of a integrated processing tool on which the invention may be practiced.

The invention includes an integrated process preferably practiced on an integrated multi-chamber tool, such as the Endura 5500 platform schematically illustrated in plan view in FIG. 13. The platform is functionally described by Tepman et al. in U.S. Pat. No. 5,186,718.

Wafers which have been already etched with via holes or other structure in a dielectric layer are loaded into and out of the system through two independently operated load lock chambers 202, 204 configured to transfer wafers into and out of the system from wafer cassettes loaded into the respective load lock chambers. After a wafer cassette has been loaded into a load lock chamber 202, 204, the chamber is pumped to a moderately low pressure, for example, in the range of $10^{-3}$ to $10^{-4}$ Torr, and an unillustrated slit valve between that load lock chamber and a first wafer transfer chamber 206 is opened. The pressure of the first wafer transfer chamber 206 is thereafter maintained at that low pressure.

A first robot 208 located in the first transfer chamber 206 transfer the wafer from the cassette to one of two degassing/orienting chambers 210, 212, and then to a first plasma pre-clean chamber 214, in which a hydrogen or argon plasma cleans the surface of the wafer. If a CVD barrier layer is being deposited, the first robot 208 then passes the wafer to a CVD barrier chamber 216. After the CVD barrier layer is deposited, the robot 208 passes the wafer into a passthrough chamber 218, from whence a second robot 220 transfers it to a second transfer chamber 222. Unillustrated slit valves separate the chambers 214, 216, 218 from the first transfer chamber 206 so as to isolate processing and pressure levels.

The second robot 220 selectively transfers wafers to and from reaction chambers arranged around the periphery. A first IMP sputter chamber 224 is dedicated to the deposition of copper. In some applications, it is desired to combine IMP deposition for bottom coverage and SIP deposition for sidewall coverage and reduced over hangs. An SIP sputter chamber 226 is dedicated to the deposition of the SIP copper nucleation layer. If at least part of the barrier layer, for example, of Ta/TaN is being deposited by IMP sputtering, a second IMP sputter chamber 230 is dedicated to a sputtering a refractory metal, possibly in a reactive nitrogen plasma. The same IMP chamber 230 may be used for depositing the refractory metal and its nitride. A CVD chamber 228 is dedicated to the deposition of the copper seed layer and possibly used to complete the filling of the hole. Each of the chambers 224, 226, 228, 230 is selectively opened to the second transfer chambers 222 by unillustrated slit valves. It is possible to use a different configuration. For example, one of the IMP chambers 224, 230 may be replaced by a second CVD copper chamber, particularly if CVD is used to complete the hole filling.

After the low-pressure processing, the second robot 220 transfers the wafer to an intermediately placed thermal chamber 232, which may be a cool down chamber if the preceding processing was hot or may be a rapid thermal processing (RTP) chamber if annealing of the metallization is required. After thermal treatment, the first robot 208 withdraws the wafer and transfers it back to a cassette in one of the load lock chambers 202, 204. Of course, other configurations are possible with which the invention can be practiced depending on the steps of the integrated process.

The entire system is controlled by a computer-based controller 240 operating over a control bus 242 to be in communication with unillustrated sub-controllers associated with each of the chambers. Process recipes are read into the controller 240 by recordable media 244, such as magnetic floppy disks or CD-ROMs, insertable into the controller 240, or over a communication link 246.

Many of the features of the apparatus and process of the invention can be applied to sputtering not involving long throw.

Although the invention is particularly useful at the present time for copper inter-level metallization, the different aspects of the invention may be applied to sputtering other materials and for other purposes.

The invention thus provides an improved sputtering chamber utilizing a combination of simple elements which nonetheless is effective at sputtering into some difficult geometries. The invention also provides a straightforward process for filling copper into high aspect-ratio holes. The invention further simplifies the plasma ignition process. All these advantages advance the technology of metal hole filling, particularly with copper, with only simple changes over the prior art.

What is claimed is:

1. A method of igniting a plasma in a plasma sputter reactor including a vacuum chamber and an electrically biasable sputter target in said chamber, said method comprising the sequential steps of:

admitting a working gas into said chamber;

igniting said working gas into a plasma while maintaining said chamber at a first pressure and applying a finite first level of power to said target;

after said igniting step, reducing said chamber to a second pressure less than said first pressure while said power is held at said first level;

after said igniting step, in response thereto and once the chamber has been reduced to said second pressure, increasing said power applied to said target to a second level greater than said first level; and completing sputter depositing of a film on a substrate in said chamber.

2. The method of claim 1, wherein said target comprises copper.

3. The method of claim 1, wherein said first level of power is no more than 5 kW normalized to the area of a 200 mm-diameter wafer and said second level of power is greater than 10 kW and no more than 24 kW normalized to the area of said 200 mm-diameter wafer.

4. The method of claim 1, wherein said reducing step includes decreasing a supply of said working gas through a port having direct access into said chamber.

5. The method of claim 4, wherein said decreasing said supply includes ceasing said supply.

6. The method of claim 1, wherein said first pressure is greater than 5 milliTorr and said second pressure is less than 5 milliTorr.

7. The method of claim 6, wherein said second pressure is less than 1 milliTorr.

8. A method of exciting a plasma in a chamber including a target and a magnetron rotatable about a back of said target having an area of no more than 20% that of said target, said process comprising the steps of:

flowing a gas comprising argon into said chamber;

igniting said gas into a plasma while maintaining said chamber at a first pressure and continuously applying a finite first level of power to said target;

after said gas has been ignited into a plasma, reducing pressure in said chamber to a second pressure lower than said first pressure;

after a beginning of said reducing step, increasing said power to said target to a second level greater than said first level; and thereafter sputtering said target.

9. The method of claim 8, wherein said first pressure is greater than 2 milliTorr and said second pressure is no more than 1 milliTorr.

10. The method of claim 8, further comprising detecting ignition of said plasma and in response thereto initiating said reducing step.

11. The method of claim 8, wherein said second level is at least twice said first level.

12. The method of claim 11, wherein said first level is no more than 5 kW normalized to a 200 mm wafer and said second level is at least 10 kW normalized to said 200 mm wafer.

13. The method of claim 8, wherein said target is a copper target.

14. A method of igniting a plasma in a plasma sputter reactor including a vacuum chamber and an electrically biasable sputter target in said chamber, said method comprising the sequential steps of:

admitting a working gas into said chamber;

igniting said working gas into a plasma while maintaining said chamber at a first pressure and applying a finite first level of power to said target;

after said igniting step, reducing said chamber to a second pressure less than said first pressure;

after said reducing step, increasing said power applied to said target to a second level greater than said first level; and completing sputter depositing of a film on a substrate in said chamber.

15. The method of claim 14, wherein said target is a copper target.

* * * * *